(12) United States Patent
Zhang et al.

(10) Patent No.: US 8,466,560 B2
(45) Date of Patent: Jun. 18, 2013

(54) DUMMY STRUCTURES HAVING A GOLDEN RATIO AND METHOD FOR FORMING THE SAME

(75) Inventors: John H. Zhang, Fishkill, NY (US); Heng Yang, Fishkill, NY (US)

(73) Assignee: STMicroelectronics, Inc., Coppell, TX (US)

( * ) Notice: Subject to any disclaimer, the term of this patent is extended or adjusted under 35 U.S.C. 154(b) by 183 days.

(21) Appl. No.: 12/982,784

(22) Filed: Dec. 30, 2010

(65) Prior Publication Data

US 2012/0168958 A1   Jul. 5, 2012

(51) Int. Cl.
*H01L 23/522* (2006.01)
*H01L 21/768* (2006.01)

(52) U.S. Cl.
USPC ............ 257/774; 257/E23.142; 257/E21.585; 257/773; 257/784; 257/786

(58) Field of Classification Search
USPC .................. 257/774, E21.585, E23.142, 773, 257/784, 786
See application file for complete search history.

(56) References Cited

U.S. PATENT DOCUMENTS

| | | | |
|---|---|---|---|
| 6,010,962 A | 1/2000 | Liu et al. | |
| 6,391,780 B1 | 5/2002 | Shih et al. | |
| 6,611,045 B2 | 8/2003 | Travis et al. | |
| 6,764,919 B2 | 7/2004 | Yu et al. | |
| 6,909,189 B2 | 6/2005 | Nanjo | |
| 7,007,259 B2 | 2/2006 | Shrowty et al. | |
| 7,314,811 B2 | 1/2008 | Tan et al. | |
| 7,605,470 B2 | 10/2009 | Ning | |
| 8,278,737 B2 * | 10/2012 | Chen et al. | 257/620 |
| 8,283,706 B2 * | 10/2012 | Cleeves et al. | 257/278 |
| 2005/0121803 A1 * | 6/2005 | Angell et al. | 257/779 |
| 2005/0196964 A1 * | 9/2005 | Smith et al. | 438/692 |
| 2006/0118960 A1 * | 6/2006 | Landis | 257/758 |
| 2007/0275551 A1 * | 11/2007 | Dunham et al. | 438/618 |
| 2008/0166859 A1 | 7/2008 | Zia et al. | |
| 2008/0283925 A1 * | 11/2008 | Berthold et al. | 257/368 |
| 2010/0261095 A1 * | 10/2010 | Grant et al. | 430/5 |

OTHER PUBLICATIONS

Feng, C. et al., "Provably Good and Practically Efficient Algorithms for CMP Dummy Fill," DAC '09, Proceedings of the 46th Annual Design Automation Conference, San Francisco, California, Jul. 26-31, 2009, pp. 539-544.

Liu, G. Y. et al., "Chip-Level CMP Modeling and Smart Dummy for HDP and Conformal CVD Films," CMP-MIC '99, Proceedings of the 4th International Chemical-Mechanical Planarization for ULSI Multilevel Interconnection Conference, Santa Clara, California, Feb. 11-12, 1999, pp. 120-127.

* cited by examiner

*Primary Examiner* — A O Williams
(74) *Attorney, Agent, or Firm* — Seed IP Law Group PLLC (57) ABSTRACT

A method of forming dummy structures in accordance with the golden ratio to reduce dishing and erosion during a chemical mechanical polish. The method includes determining at least one unfilled portion of a die prior to a chemical mechanical planarization and filling the at least one unfilled portion with a plurality of dummy structures, a ratio of the dummy structures to a total area of the unfilled portion being in the range of 36 percent and 39 percent. A die formed in accordance with the method may include a plurality of metal levels and a plurality of regions at each metal level, each region having a plurality of dummy structures formed as golden rectangles.

15 Claims, 10 Drawing Sheets

DUMMY STRUCTURES HAVING A GOLDEN RATIO AND METHOD FOR FORMING THE SAME

BACKGROUND

1. Technical Field

The present disclosure is directed to a method and system for determining a dummy structure fill pattern to minimize erosion and dishing during chemical mechanical polishing, and more particularly, to a method for spacing dummy structures in accordance with the golden ratio.

2. Description of the Related Art

Chemical mechanical polishing (CMP) is a planarization process used in semiconductor manufacturing to form uniform surfaces at various levels on a wafer. A semiconductor wafer has various levels of metal conductors with insulators in between each metal layer.

Figure 1:
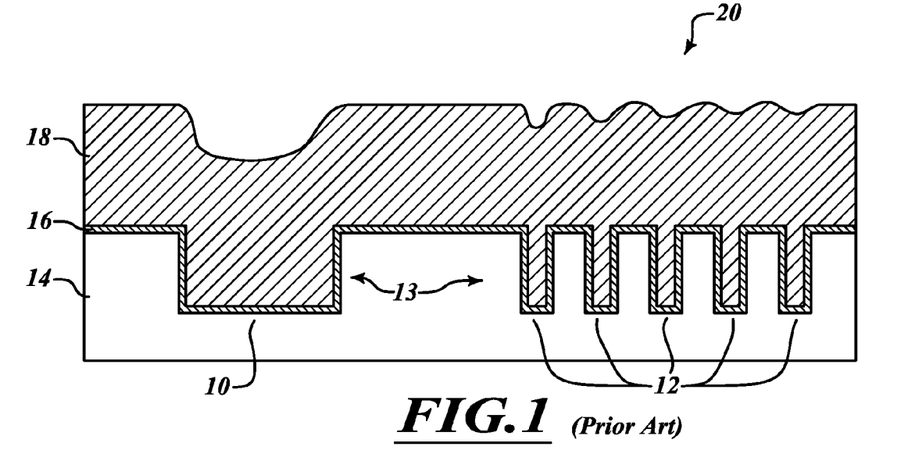
FIGS. 1-3 are cross-sectional views of a copper deposition and planarization process.
Figure 2:
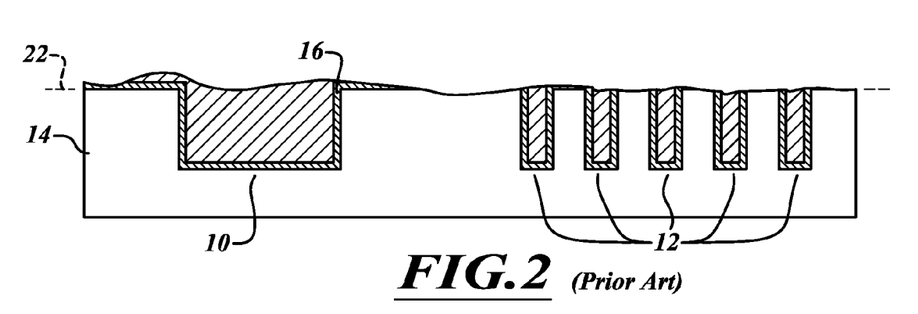
Figure 3:
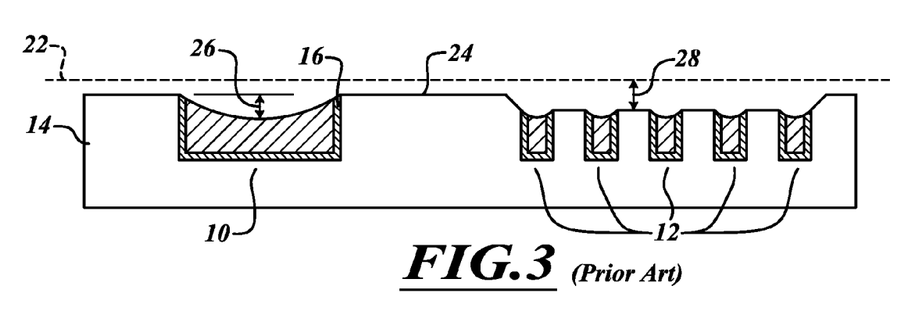

FIGS. 1-3 are cross-sectional views of a known process of forming first and second metal structures 10, 12 in trenches 13 in a dielectric layer 14 at one of the metal levels. The first metal structure 10 is a metal interconnect that is used in the circuitry and the second metal structure 12 is a dummy structure, which is not used for circuitry but is used to assist in planarization. The dielectric layer 14 has been patterned to form trenches 13 to define the metal structures 10, 12 in the process of manufacturing the wafer.

A barrier layer 16 is formed on the dielectric layer 14 to protect the dielectric layer 14 from a copper layer 18. The barrier layer 14 may be tantalum or tantalum nitride. A copper plating or deposition process forms excess copper structures that have irregular or non-uniform features 20 across the top surface of the die. The various copper deposition processes form different non-uniform features 20.

Manufacturers use CMP to remove these non-uniform features 20 and the excess portions of the copper layer 18 to form the metal structures 10, 12. CMP takes advantage of cooperative effects of both physical and chemical forces acting on the surface of the wafer. Both the wafer and the pad counter rotate to remove the non-uniform features 20 as an abrasive chemical solution, called a slurry, passes between the pad and the wafer. Hydrogen peroxide is often used as the slurry to remove copper, because hydrogen peroxide reacts with the copper form a soft layer that increases the removal rate and aids in removing the non-uniform features 20.

CMP polishes sequentially or simultaneously portions of all three materials, the copper layer 18, the barrier layer 16, and the dielectric 14. FIG. 2 is an intermediate step in the CMP process where the excess portions of the copper layer 18 and the barrier layer 16 have been removed before any of the dielectric layer 14 has been removed. Some CMP processes will stop on the barrier layer 16 and switch to a different slurry. For example, since tantalum has different polishing properties than copper it may be desirable to change slurries and possibly a different pad to obtain a high selectivity between the barrier and copper. If the copper thickness is not uniform, the barrier layer 16 is exposed for longer periods of time where the copper is thinner as the thicker areas of copper are polished. Overpolish refers to the time from when the barrier layer 16 is first exposed and when the last of the thicker area of copper layer 18 is removed.

In FIG. 2, a first top surface 22 of the dielectric layer 14 and the metal structures 10, 12 are exposed by the CMP. After the dielectric layer 14 is first exposed, in some circumstances, the polishing process continues in an overetch to remove all the copper residue and strippers. This will also cause removal of the top portion. of the dielectric layer 14. This dielectric removal addresses underlying topography problems remaining from previous CMP steps and other irregularities in the first top surface 22.

The dielectric layer 14 may be an ultra low-k dielectric of the type normally used between metal layers. Ultra low-k dielectrics are used as interlayer dielectrics because of their low dielectric constants and their ability to reduce the capacitance of metal interconnects. However, ultra low-k dielectrics have air gaps in the material that can cause the ultra low-k dielectrics to degrade more quickly during CMP.

In order to remove the portions of the dielectric layer 14, a different slurry is selected. The slurry depends on both a hardness of the material to be removed and the chemistry of the slurry.

FIG. 3 is the cross-sectional view of the metal structures 10, 12 after the portions of the dielectric layer 14 have been removed. A second top surface 24 of the dielectric layer 14 is exposed. As the dielectric layer 14 is removed, the copper in the metal structures 10, 12 is also removed. Dishing causes the copper in the metal structure 10 to be lower than the second top surface 24 by a first distance 26. Dishing is a result of accelerated polishing at a center of a large metal structure, such as the first metal interconnect 10. Dishing is more prevalent at the global wiring level of the die. The dielectric layer 14 acts as a stop for the pad of the CMP, however, the pad elastically deforms with the back pressure and removes portions of the larger metal interconnects 10.

Erosion is another potential problem during CMP when there is an insufficient amount of the dielectric layer 14 to act as a CMP stop. This can occur where there is a high density of metal structures with small amounts of dielectric between each metal structure, for example, in dense sub-micron copper regions of a die. As in FIG. 3, erosion causes the copper in the metal structures 12 to be lower than the second top surface 24 by a second distance 28. These dishing and erosion issues can occur at the poly level or at the various metal levels. In addition, dishing and erosion are more significant at the edges of the die because these die polish faster.

CMP provides a more uniform planarization when the metal structures 10, 12 are evenly distributed across the wafer. In other words, CMP performs best when there is a uniform density of the metal structures 10, 12. However, the density and size of the metal structures 10, 12 vary at each metal level. In places where no metal structures 10, 12 are formed, unfilled portions of the dielectric layer 14 remain. These unfilled portions are filled with dummy structures to achieve a more uniform density of metal or poly for each metal or poly level, i.e., areas of each die that have low density of metal feature filled with dummy structures. The dummy structures are formed simultaneously with the metal structures 10, 12, such as with a single mask that includes mask features for both the metal structures and the dummy structures.

When these unfilled portions are not filed with dummy structures, the uneven distribution of the metal structures 10, 12 can cause dishing and erosion. The dishing and erosion can cause metal interconnects to not operate correctly by shorting the interconnect. However, determining the optimal arrangement and density of dummy structures is difficult.

BRIEF SUMMARY

The present disclosure provides a method for filling selected portions on each level of a die with dummy structures to achieve near zero erosion and dishing after CMP. The method is implemented at design rule checks after the routing is finalized for each level. More particularly, the metal interconnect structures are designed and their locations are determined. Then the portions on that level of the die that do not have structures are located and then, depending on their size, are filled with dummy structures in accordance with the golden ratio. Once the pattern of the dummy structures is determined, a mask is made to form the interconnects and the dummy structures simultaneously.

Forming the dummy structures in accordance with the golden ratio creates a uniformity across the level of the wafer that significantly reduces erosion and dishing during CMP.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

DETAILED DESCRIPTION

In the following description, certain specific details are set forth in order to provide a thorough understanding of various embodiments of the disclosure. However, one skilled in the art will understand that the disclosure may be practiced without these specific details. In some instances, well-known structures associated with the manufacturing of semiconductor wafers have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

The present disclosure is directed to a method of filling selected portions of a die on a wafer with dummy structures to reduce or eliminate dishing and erosion caused by CMP. The method includes determining a grid pattern having a plurality of cells, determining unfilled portions of a die that do not have any features formed therein, determining a sub-first grid pattern that corresponds to the unfilled portions, and filling selected regions of the unfilled portions with dummy structures in accordance with the golden ratio.

The golden ratio is an empirical number that has been used in various geometric shapes and patterns for many years.

Two quantities, a and b, are in the golden ratio if:

$$\frac{a+b}{a} = \frac{a}{b} \approx 1.6180339887\ldots$$

where a>b. In other words, the two quantities are in the golden ratio when the sum of both quantities to the larger quantity is equal to the ratio of the larger quantity to the smaller quantity. The golden ratio frequently appears in geometry and is used in forming golden rectangles and golden sections that are considered to be aesthetically pleasing.

Figure 4A:
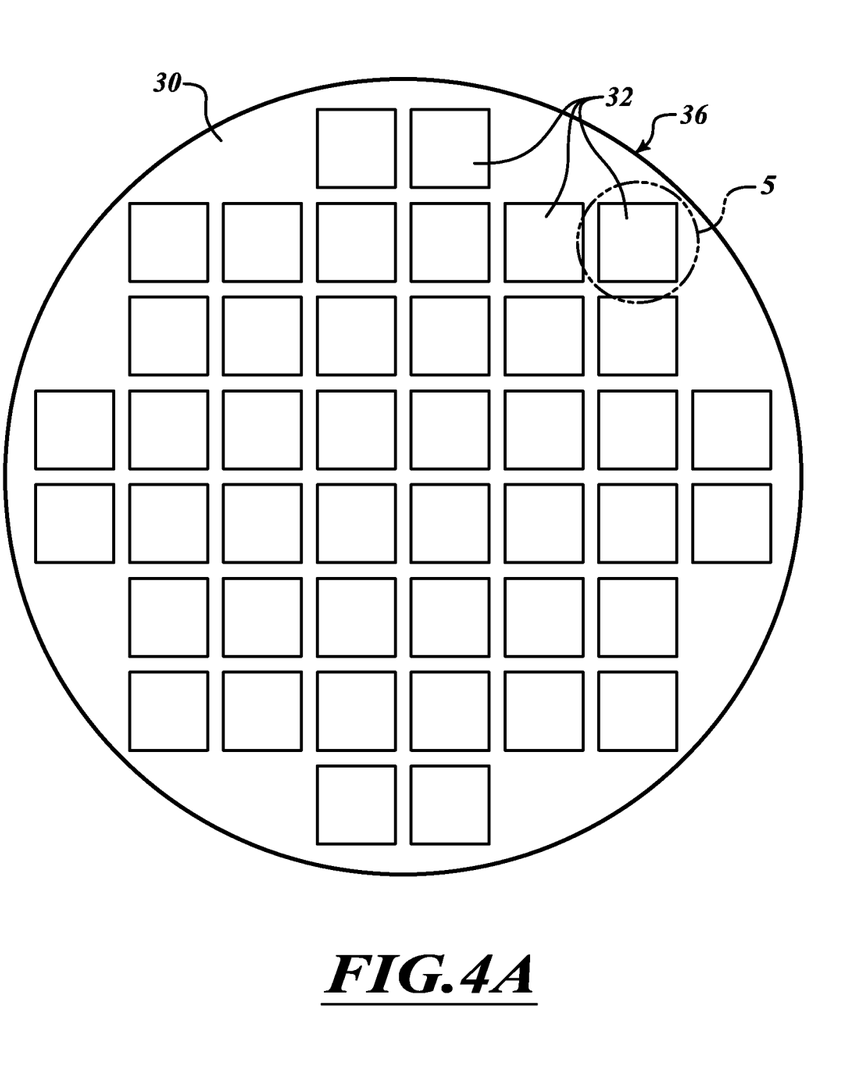
FIG. 4A is a plan view of a wafer having a plurality of die.

FIG. 4A is a top down view of a wafer 30 having a plurality of die 32. The wafer 30 may be formed of monocrystalline silicon or other suitable semiconductor material. Each of the die 32 are simultaneously formed by depositing and patterning a series of material layers on the wafer 30. The die 32 formation often begins by forming a plurality of trenches in the bare silicon of the wafer 30 and then forming a layer of polysilicon on the wafer 30 and in the trenches. This layer of polysilicon will be referred to herein as a poly level.

Subsequently, a plurality of metal or otherwise conductive layers are formed and patterned on the wafer 30 on top of the poly level. Each metal layer will be referred to herein as a metal level. These metal levels include forming metal interconnects and other structural features. The metal levels are formed by plating or other deposition processes. At the poly level and at each of the metal levels, excess portions of the polysilicon or metal are removed by CMP. Achieving planarity at each level is important to ensure proper alignment of subsequent processing steps. The goal is to have global planarity, both across the entire wafer 30, and local, across each die 32. The problems experienced in the prior art were explained with respect to FIGS. 1A-1C; the present invention reduces these problems and produces a semiconductor die with more uniform planarity across each individual die and across the waver than was possible with some prior art techniques.

Figure 4B:
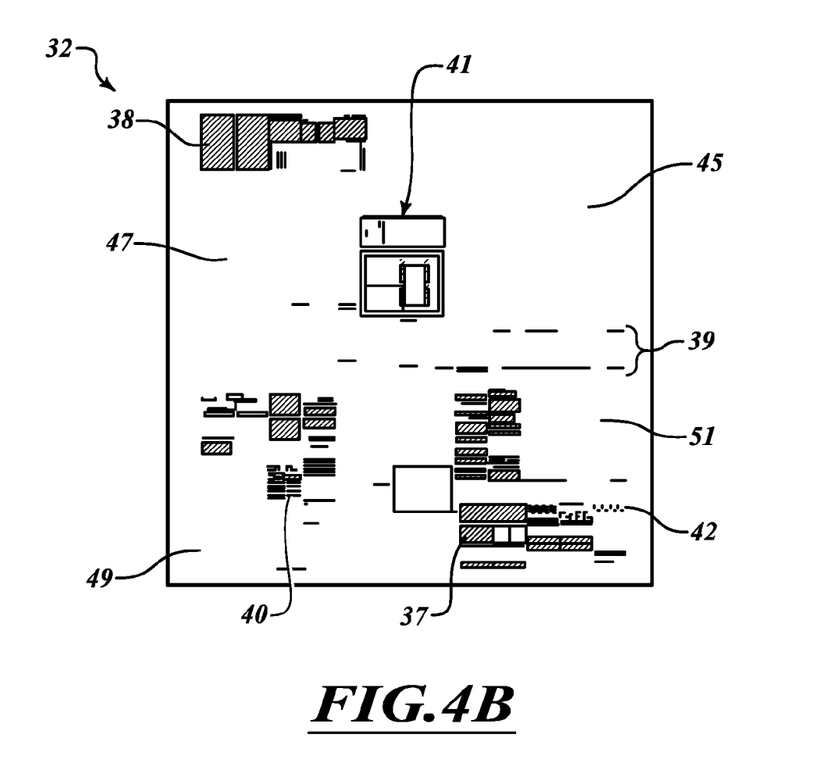
FIG. 4B is a plan view on one die.

FIG. 4B is one example of the die 32 at a particular level. In the example provided, the die 32 is at a metal level, such as metal 2. Namely, each of the features shown is where metal 2 is present on the die. Large areas such as 38 and 37 represent dense locations of the patterns, so this is merely indicated by the entire area being filled. Other locations on the die at this level, such as 39 and 41, have some metal present but are sparsely populated. Other sections of the die, such as 45, 47, 49, and 51 are large areas on the die in which no features are present. These are open spaces which are unfilled portions and have no structures present at this particular level of metal 2. Accordingly, when CMP is performed on this level, structures that are adjacent to the large open areas such as 45, 47, etc., will be subject to dishing and erosion. Accordingly, the open areas should be filled with dummy structures in order to prevent dishing and erosion of adjacent structural features which are important for circuit operation. These unfilled areas will be filled with dummy structures according to principles of the various embodiments as described herein.

Figure 5:
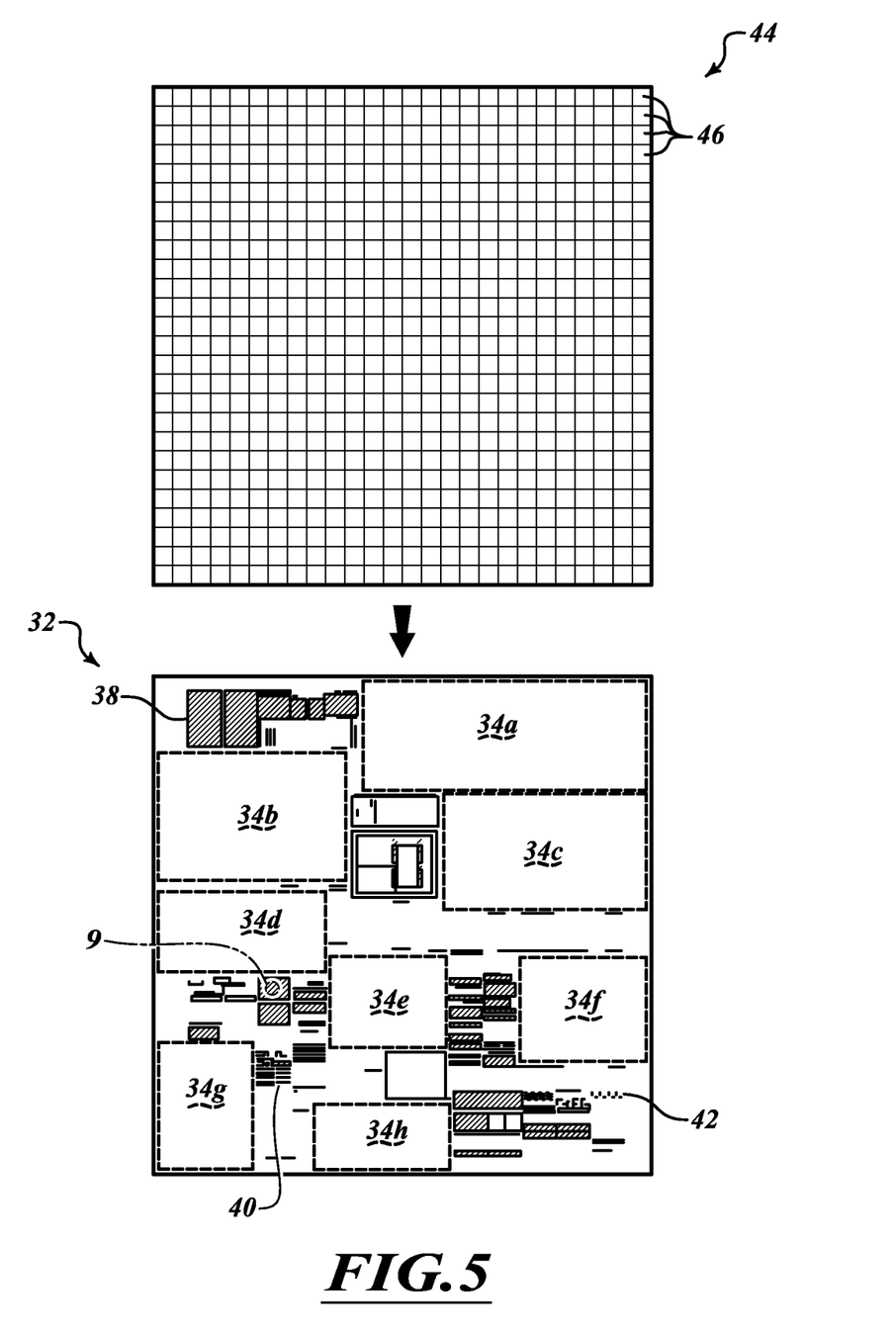
FIG. 5 is a plan view of a die from the wafer of FIG. 4 and a grid for determining unfilled portions on the die.

FIG. 5 is a top down view of one of the die 32 of the wafer 30. The example provided for die 32 is an application specific integrated circuit (ASIC), however, the die 32 is representative of any of die that has unfilled portions 34 at any level at which a CMP is to occur and that are eventually filled with dummy structures 48 (see FIG. 7B). Other types of die include, microprocessors, amplifiers, and converters, to name a few. Regardless of the type of die, there are variances in a density of structural features and interconnects formed at each poly and metal level. These variations in the density of structural features and interconnects create a plurality of the unfilled portions 34 at each level. A location of each unfilled portion 34 will depend on the arrangement of the structural features and the interconnects at each metal and poly level. The unfilled portions 34 are filled with dummy structures 48 to make the density at each level more uniform.

The dummy structures 48 are used to reduce dishing and erosion problems caused by non-uniform distribution of the structural features and the interconnects during CMP. Wide metal interconnects or larger structural features are typically subject to dishing during CMP, especially when there are large unfilled portions 34, see FIG. 3. The dummy structures 48 improve uniformity across the die 32 and the wafer 30 and thus prevent problems associated with the CMP process.

The dishing and erosion problems are particularly prevalent with copper CMP because of copper's ductility. Success of a copper CMP process is judged by the overall planarity of the surface of the die 32 and the wafer 30 and by the amount of copper lost. More uniform widths of the interconnect and structural features before the copper CMP process results in less copper loss, i.e., less dishing and erosion. The reduction in dishing and erosion impact the resistivity of the interconnects at each level and improves reliability of the final device. Dishing can cause significant problems with depth of focus problems in subsequent lithography because of the planarity issues.

More uniform distribution of the interconnects and structural features at each level also improves the polishing rate during the CMP process and leads to fewer defects, such as scratches, particles, residues, oxide loss, and corrosion. This also reduces the overall cost of the process. Copper residues are of particular concern because the residues can short lines and kill the final device.

The ASIC die 32 is formed from a standard cell library, which means circuit elements used often have standard sizes and are not optimized for the die. Thus, an ASIC will often have large open spaces at various levels which may cause problems during a CMP etch. Regardless of the type of circuit elements formed on the die 32, there will be unfilled portions 34 at each level. FIG. 5 is the metal two level of the ASIC die 32, however, the die 32 is representative of any poly or metal level during the manufacturing process for which a CMP is to be performed.

Since the circuit elements of the ASIC die 32 have a fixed size, the arrangement of the circuit elements on the ASIC die are often not manipulated to make the dimensions as small as possible and therefore result in larger unfilled portions 34 than some other types of die. For example, the ASIC die 32 of FIG. 5 has several large unfilled portions 34a-34h.

A software tool is utilized in conjunction with hardware tools to determine the unfilled portions 34a-34h and to subsequently fill these unfilled portions 34a-34h with the dummy structures 48. At each level of the wafer 30, the software tool identifies the unfilled portions 34 which are suitable for dummy structure insertion. The unfilled portions 34 are identified after routing of each level during the design process, i.e., after the locations and sizes of the structural features and interconnects are determined.

The software tool overlays the die 32 with a grid pattern 44. In this embodiment, the grid pattern 44 is selected from one of several standard grid patterns. The grid pattern 44 includes a plurality of cells 46 in a 24 cell by 29 cell arrangement, as shown in the top portion of FIG. 5.

As shown in FIG. 5, eight portions of the die, 34a-34h, have been selected to have dummy structures placed therein. Dummy structures are not placed at every single location in the die that does not have a usable interconnect, rather the dummy structures are positioned in unfilled portions 34 sufficiently large that excessive dishing and erosion may occur if dummy structures are not placed in these locations. Thus, smaller spaces between structural features are closely adjacent to each other do not need to have dummy structures placed therein in order to prevent dishing or erosion. If unfilled portions are greater than a minimum size, which can be easily determined by running a few experimental wafers and performing CMP tests, then the software algorithm will select these spaces to be filled with dummy structures. There are various techniques for selecting those areas to be filled with dummy structures, which will be explained in more detail with respect to FIG. 8 later herein.

Once the areas to be filled with dummy structures have been determined, the ratio of dummy structures to unfilled space is determined for each separate area according to principles of various embodiments as will now be explained.

A structural feature may be a metal interconnect line, a trench filled with metal, a plug, a gate electrode, or any other structure of the type commonly used in integrated circuits. The features are usually constructed of metal, such as copper or aluminum, but might be constructed of other materials, such as a polysilicon, a nitride or oxide, or other elements.

Figure 6:
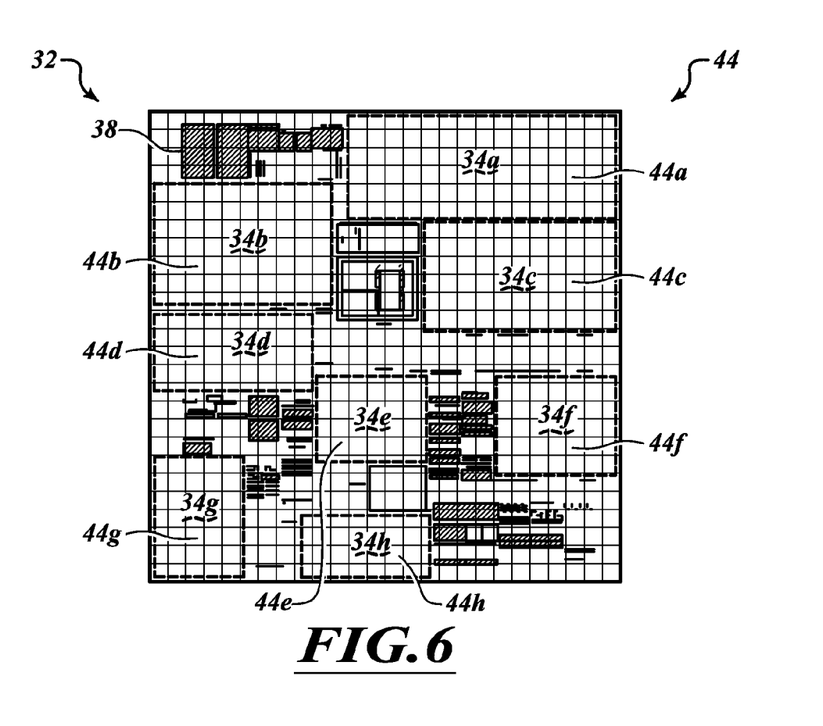
FIG. 6 is a plan view of the die and the grid of FIG. 5.

FIG. 6 shows the grid pattern 44 positioned over the ASIC die 32. The software tool evaluates each cell 46 of the grid pattern 44 to determine if there are any structural features in the cell. The software tool selects sub-grids 44a-44h that correspond to the unfilled portions 34a-34h. In this embodiment, the sub-grids are divided into several individual rectangular sub-grids 44a-44h. In one embodiment, adjacent sub-grids may be combined. For example, a first sub-gird 44a and a third sub-grid 44c that are found to be adjacent to each other may be combined to form a larger polygonal sub-grid. A second sub-grid 44b may be combined with a fourth sub-grid 34d to form a larger polygonal sub-grid. In other embodiments, other smaller sub-grids may be located depending on the minimum density requirement of the design process.

According to a first embodiment, each of the cells 46 is a rectangle. Further, each of the sub-grids 44a-44n is in the shape of a rectangle. If adjacent sub-grids are determined then the sub-grids may be combined into a new single sub-grid which, when combined, may not be a rectangle but will be a polygon.

Generally, design rules for each fabrication process have a minimum density of structural features to be present at each level. The structure density for features at any level is the sum of the total of the area of all of the features of that region divided by the total area of that region. For improved CMP results, the overall density of features for an area of the die at each level should meet a minimum density requirement. Of course, at each level, the features, whether they are interconnects, circuit structures, plugs or the like, have a wide range of sizes, which results in variations in the density of features of each level that will have metal or poly features thereon.

If the interconnects and circuit structures alone do not meet the minimum density requirement for a particular design rule, dummy structures 48 are added to that level to reach the minimum density. The density of the dummy structures should be generally uniform before the CMP process is executed in order to obtain a smooth top surface. As described in more detail below, locating the unfilled portions 34 and filling them with the dummy structures 48 in accordance with the dummy ratio will result in improved uniformity after CMP, including significantly reduced dishing and erosion.

Figure 7A:
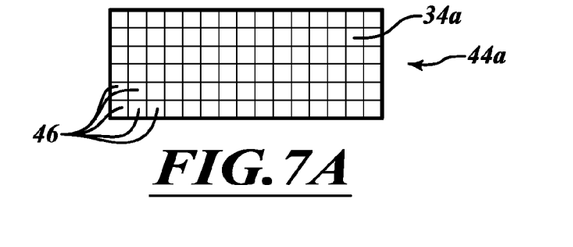
FIG. 7A is an enhanced view of a segment of the grid of FIGS. 5 and 6.

FIG. 7A is an enhanced view of the first sub-grid 44a, which, in this example, is a segment of 15 by 6 cells 46. The first sub-grid 44a includes a total of 90 cells. In one embodiment, the software tool determines how to fill this empty space 34a with dummy structures 48, see FIG. 7B. In one embodiment, the software tool determines the density locally for each sub-grid, as in the first sub-grid 44a, however, in other embodiments, the software tool determines the density for a whole die as one consideration or globally across the entire wafer 30.

Figure 7B:
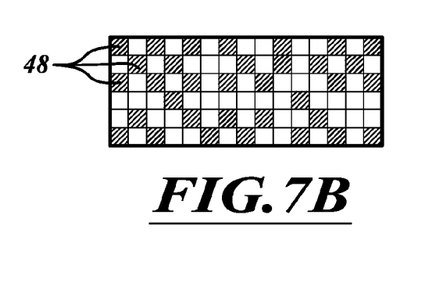
FIGS. 7B-7D are various patterns of dummy structures formed in accordance with an embodiment of the present disclosure.

FIG. 7B is the grid pattern 44a having the dummy structures 48 filled in accordance with the golden ratio. As mentioned above, the golden ratio is approximately 1.61803. The reciprocal of the golden ratio is 0.61803, namely the reciprocal of the golden ratio equals the golden ratio minus 1. Once the software tool determines the unfilled portions 34, the number of cells 46 in the unfilled portion is computed. The software tool then determines the number of cells 46 to be filled with the dummy structures 48 by using the golden ratio to fill selected cells. The following equations provide one method of determining the number of cells 46 to fill with the dummy structures 48.

$$C = A + B$$

where

C=the total number of cells 46;

A=the number of cells 46 filled with dummy structures 48; and

B=the number of cells 46 that are left empty.

The golden ratio is then used to select the values for A and B. Namely, A and B will be in a golden ratio with respect to C. The calculation according to the golden ratio can be performed as follows:

$$\frac{B}{C} = 0.6180339 = \frac{1}{1.6180339} = \frac{1}{\text{golden ratio}}$$

$$\frac{A}{C} = 0.382 = 1 - \frac{1}{1.6180339} = 1 - \frac{1}{\text{golden ratio}}$$

Applying the above equations to a group of 90 cells yields the following results:

$$\frac{34}{90} = 0.377777 = \sim 1 - \frac{1}{\text{golden ratio}}$$

A ratio of remaining cells 46, not filled, to the total number of cells 46 is:

$$\frac{56}{90} = 0.622222 = \frac{\sim 1}{\text{golden ratio}}$$

The results of this example are shown in FIG. 7B in which 34 of the cells have dummy structures filling them and 56 of the cells are left open and unfilled. Namely, in FIG. 7B, 34 of the cells 46 are filled with dummy structures 48 and 56 of the cells 46 remain as the dielectric or ULK used for that level's interlayer dielectric.

Accordingly, the first sub-grid 44a is filled to have a 38% pattern factor, where 38% of the total sub-grid 44a is filled with dummy structures 48. This corresponds to 62% of the total sub-grid 44a remaining empty, i.e., 62% of the interlayer dielectric that covered the empty space 34a remains. This pattern factor is the golden ratio pattern factor.

The dummy structures 48 are formed in an irregular pattern distributed throughout the first sub-grid 44a. However, other patterns are suitable as long as the ratio of filled cells to total cells is in accordance with the golden ratio. In the example of FIG. 7B, the dummy structures 48 are formed to fill each cell 46, so each dummy structure 48 is rectangular in shape. However, the dummy structures 48 can be any shape such as a different rectangle, cylindrical, or polygonal, such as a cross. The dummy structures 48 formed in the golden ratio pattern factor result in near zero erosion and dishing after CMP processing.

Figure 7C:
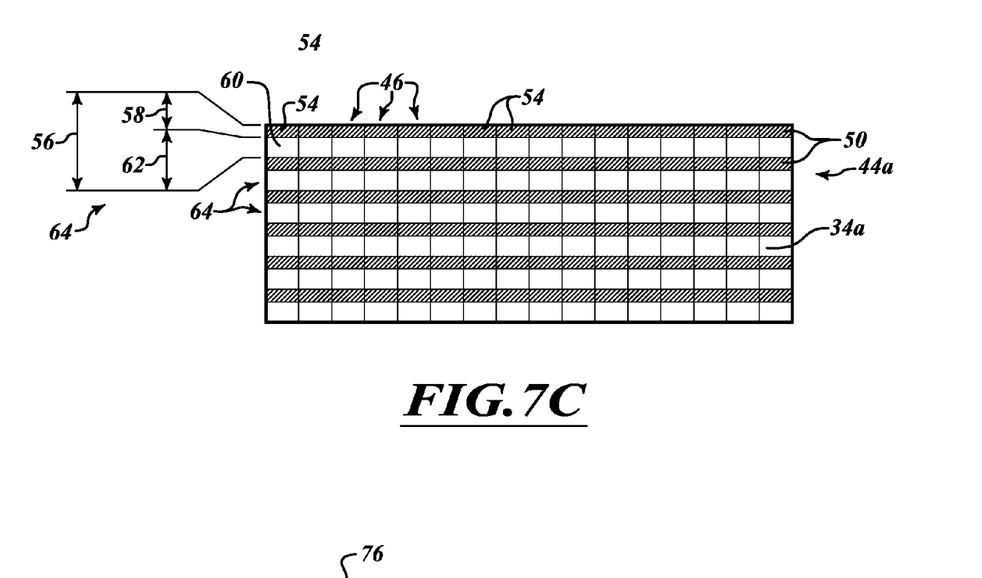
Figure 7D:
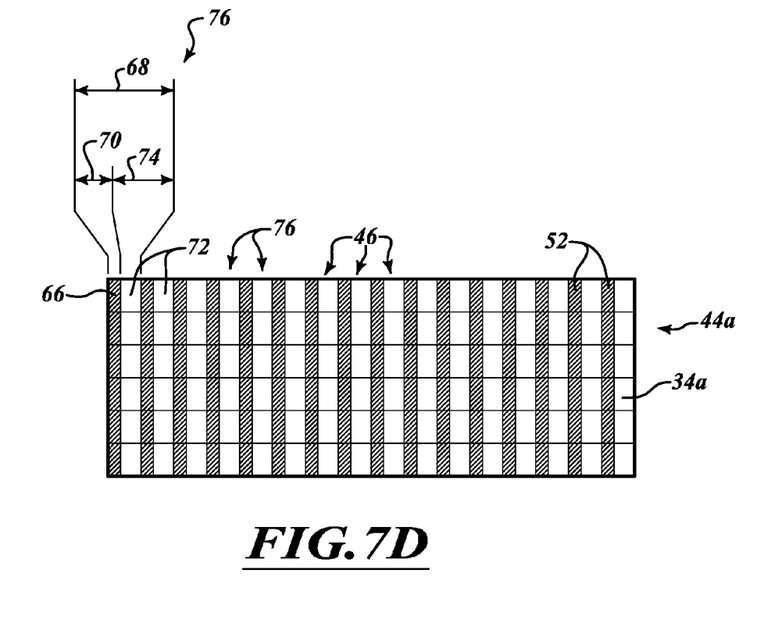

FIGS. 7C and 7D are further examples of filling an empty space with dummy structures. In these examples, horizontal and vertical linear dummy structures 50, 52 are formed in accordance with the golden ratio. FIG. 7C is the sub-grid 44a, which corresponds to the unfilled portion 34a wherein a first portion 54 of each cell 46 is filled with the dummy structure 50 and a second portion 60 remains empty. The ratio between the filled portion 54 and the empty portion 60 is the golden ratio. An example of this will now be explained. Each cell 46 has a first length 56. The first portion 54 of each cell 46 extends a second length 58, which is 38% of the first length 56. An unfilled portion 60 of each cell 46 extends a third length 62, which is 62% of the first length 56. In this example, for ease of manufacture, the first portion 54 of each cell 46 in each row 64 is filled with the dummy structures 50, which makes the horizontal dummy structure while the second portion 60 is left empty.

FIG. 7D is the sub-grid 44a, which corresponds to the unfilled portion 34a in which another example of a second pattern is used. In this case, a second portion 66 of each cell 46 is filled with the dummy structure 52. Each cell 46 has a first width 68. The second portion 66 of each cell 46 extends a second width 70, which is about 38% of the first width 68. An unfilled portion 72 of each cell 46 extends a third width 74, which is about 62% of the first width 68. For ease of manufacture, the second portion 66 of each cell 46 in a column 76 are filled with the dummy structures 52, which makes the vertical dummy structure.

The horizontal dummy structures 50 may be used when a majority of the structural features or interconnects near the unfilled portion 34 are in a horizontal configuration and the vertical dummy structures 52 may be used when a majority of the structural features or interconnects near the unfilled portion 34 are in a vertical configuration.

Figure 8:
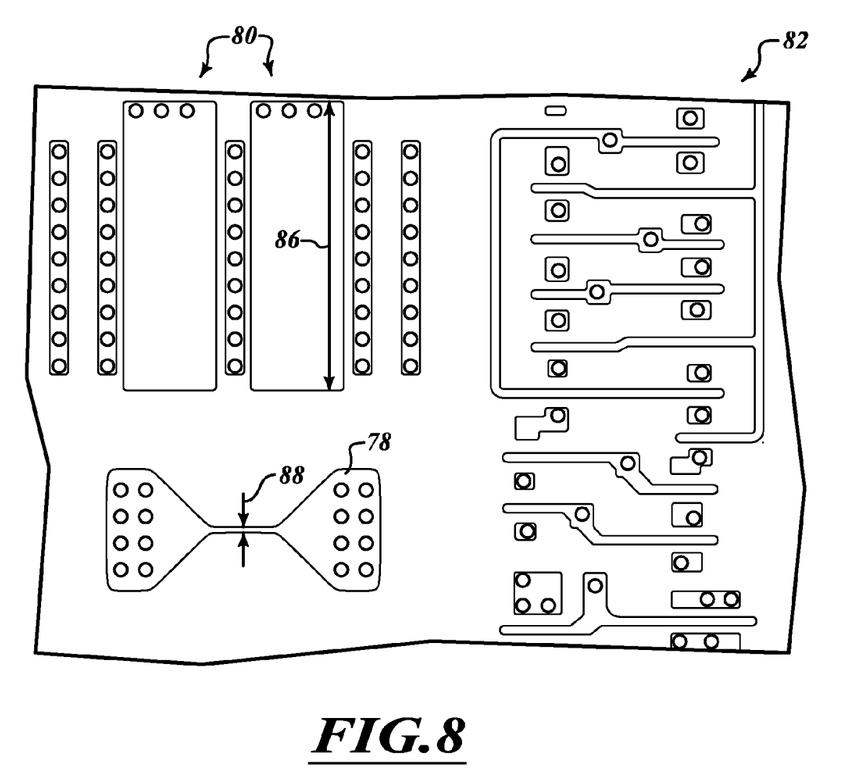
FIG. 8 is an enhanced view of a plurality of circuit features of the die of FIG. 5.

The size of each cell 46 can be selected according to a number of techniques, one of which is illustrated in FIG. 8 and others of which are shown in FIGS. 5 and 9A-9D. In one embodiment, the size of the cell 46 is selected based on the design rule for a particular level in the die to be equal to some multiple of the smallest design feature. For example, if the minimum design feature of a particular level is 90 nm, then the size of the cell 60 will be some even multiple of this minimum dimension, for example, two times larger such as 180 nm², or four times larger, such as 360 nm². Using the technique of a multiple of the minimum feature size design rule permits the size of cell 46 to be selected in advance of examining the layout and will be the same size for each level in the entire die.

On the other hand, many levels in the die will have features which are substantially larger than the smallest design rule permitted on the die. The smallest design rule is commonly used at the poly levels and also at the first and second metal levels. However, at upper metal levels, for example metal 3-metal 5, the smallest feature size may be several times larger than the smallest design rule for that die. For example, if the smallest design rule is 90 nm, the smallest feature size at some given level may be in the range of 300-600 nm, and many of the structures at that level may have widths or lengths in the range of 1000-2000 nm. Accordingly, in many cases it is desired to have a cell size which accommodates the actual size of the features on that particular level of the die for which the dummy structures are being made. FIG. 8 illustrates one example by which the cell size can be custom selected for each level of the die.

Figure 9A:
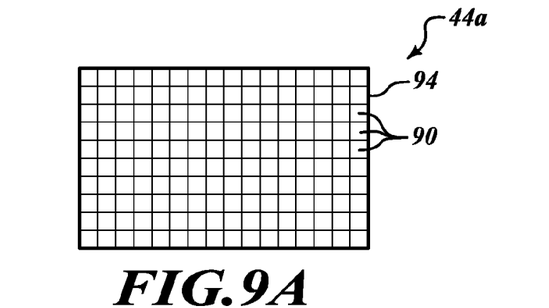
FIGS. 9A-9D are alternative grid patterns and dummy structures in accordance with other embodiments of the present disclosure.
Figure 9B:
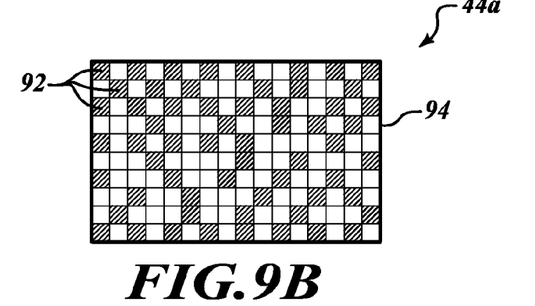

FIG. 8 is a top plan view of a plurality of structural features and interconnects at a poly or metal level, including a fuse 78, resistors 80, and a plurality of transistors 82. This may be an enhanced view of one of the features from the ASIC die 32 of FIG. 5. In one embodiment, the size of the cells in the grid pattern 44, shown in FIGS. 9A and 9B, is determined by measuring a largest length 86, $L_{max}$, and a smallest length 88, $L_{min}$, of the structures at the poly or metal level to be filled with dummy structures.

A dimension, $L_{opt}$, of the length of each side of each square cell 46 is determined by one of the following two equations:

$$L_{opt1} = L_{min} + 0.618(L_{max} - L_{min}) \quad (1)$$

$$L_{opt2} = L_{min} + 0.382(L_{max} - L_{min}) \quad (2)$$

The first equation (1) may be used if of a majority of the features at the metal or poly level are closer to the largest width 86. The second equation (2) may be used if the majority of the features are closer to the smallest width 88.

Namely, the length and width of the cell 46 is determined based on the length and width of the minimum and maximum features found in the circuit present at that level of the die. The length of each cell will be larger than the length of the smallest circuit feature by some amount, the amount being determined based on the size of the largest feature in the area under consideration. The above two equations provide two examples by which the size of the cell is determined. Thus, in each case the cell will have a dimension which is larger than the smallest circuit feature by some amount, the amount larger being determined based on the largest circuit feature on that level. Accordingly, in some embodiments, the grid 44 is created from a plurality of cells 46 whose size is selected by computer programming analyzing the features in the circuit which is to be laid out and then selecting the cell size based on the size of such features in order to create cells which are not so small as to attempt to put dummy patterns where they are not needed or so large that open spaces which need dummy patterns are left unfilled. As previously mentioned, other methods may be used for selecting the cell size, such as equal to two times the minimum design feature.

FIG. 9A is a sub-grid 94, which may correspond to the unfilled portion 34b of the die 32. The sub-grid 94 is a golden rectangle, i.e., there are ten rows by 16 columns, resulting in a ratio of rows to columns of 0.62. In addition, each of the cells 90 is square with dimensions that can be determined by the first or the second equation.

The first equation (1) will result in the square cells 90 having a larger dimension, which means more metal or poly will be used to form a plurality of dummy structures 92. When a majority of the structural features and interconnects are larger structures, the dummy structures will be larger to make a more uniform distribution across the metal or poly level.

The second equation (2) will result in the square cells 90 having a smaller dimension, which means less metal or poly will be used to form a plurality of dummy structures 92. When a majority of the structural features and interconnects are smaller structures, the dummy structures will be smaller to make a more uniform distribution across the metal or poly level.

As described above, each unfilled area will be filled with the dummy structures 92 in accordance with the golden ratio. For example, in FIG. 9B 38% of the cells 90 are filled with the dummy structures 92.

In an alternative embodiment, the die is divided into sections, which may be golden rectangles. Each of the sections may be evaluated to determine a ratio of structural features and interconnects to the total space in each section. If the percentage of structural features compared to total space is greater than 62%, then the first equation (1) is used to determine the dimensions of the square cell 90. If the percentage of structural features compared to total space is less than 38%, then the second equation (2) is used to determine the dimensions of the square cell 90. If the percentage of structural features compared to total space is between 62% and 38%, then the first equation (1) is used if the percentage is closer to 62% and the second equation (2) is used if the percentage is closer to 38%.

Figure 9C:
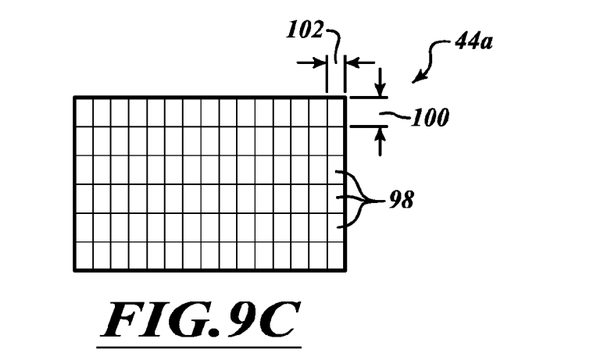

FIG. 9C is another grid pattern 96 with a plurality of cells 98 that are golden rectangles having a length 100 and a width 102. A ratio of the length 100 to the width 102 is in accordance with the golden ratio. A plurality of dummy structures, not shown, can fill the grid pattern 96 in accordance with the golden ratio so that both the cells 98 and the number of dummy structures are in accordance with the golden ratio.

Figure 9D:
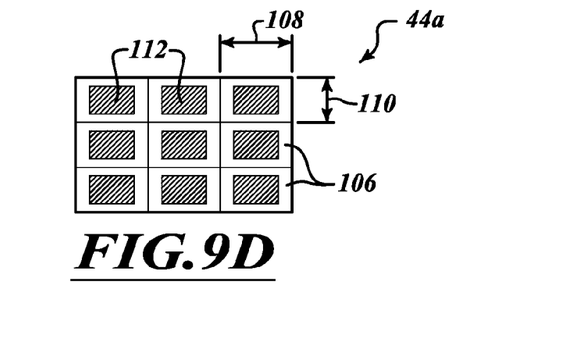

FIG. 9D is another grid pattern 104 having a plurality of cells 106, which are each golden rectangles having a length 108 and a width 110. The length 108 and width 110 are formed in accordance with the golden ratio. In addition, a plurality of dummy structures 112 is formed in a center part of each cell 106. Each dummy structure 112 is 38% of the total space of each cell. In this embodiment, the dummy structures 112 are scaled rectangles for each cell 106. However, the dummy structure 112 may be any other suitable shape, such as cylindrical or polygonal.

The portions of the die which are to be filled with dummy structures can be determined according to a number of alternative embodiments. In a first embodiment, a few experiments are run on a die to determine the size of an open space at a given level which will create undesirable dishing in adjacent structures. By running a few test wafers and performing CMP, the acceptable size of an open space adjacent usable structural features can be determined which become sufficiently large that dishing and erosion may occur. As previously explained, the ratio of structures to unfilled structures for a die or a wafer is selected to prevent dishing and erosion. It is not necessary that the entire die or the entire wafer be filled with uniform structures. Rather, if enough circuit structural features are adjacent to each other in a given area, then no dummy patterns are needed and the CMP will not cause dishing or erosion. If the size of the unfilled area is too large adjacent structural features, then dishing and erosion will occur in those structural features which are adjacent to the unfilled areas.

According to alternative embodiments, the software algorithm may also be used to select those areas 34 which are sufficiently large to be filled with dummy structures. In one embodiment, after the size of each cell 46 is determined, then the level under investigation is overlaid with a grid made of these cells 46 of the die. Each cell 46 is then examined to determine if any current feature is within any portion of the cell. If any cell has any portion, even a small part of it, with a feature therein, then the cell is considered filled and no further examination of that particular cell is formed. If a cell 46 is completely empty of any features, then it is considered an empty cell.

If a grouping of cells is found which is larger than a selected size, then the space in which the cells are located is determined to be a large enough area that dummy structures must be placed in this area. According to one preferred embodiment, the selected size of grouping for empty cells for which dummy structures are made is a grid of 6×6. Namely, if a 6×6 grid of adjacent cells are completely empty than this is of a size sufficiently large that dummy structures will be placed within this empty area and all adjacent cells to this grid which are empty will be grouped into the empty area to form a rectangle or a polygon of the unfilled space. In other embodiments, the cell size may be a golden ratio of cell size, for example, a rectangle of cells having the shape of a golden rectangle. Generally, the size of an open area which will be sufficiently large to require dummy structures will be at least 2-4 cells in width and 3-6 cells in length. If a single row of many cells is empty and there are structures in cells adjacent to the single row, then the space will usually not be considered large enough that dummy structures will be needed. Accordingly, the size of the grid for the smallest area which would be considered an unfilled area for which dummy structures are needed may be a 4×4 grid, a 4×6 grid, a 6×9 grid, or other combinations. In some embodiments, grids of 2×2 cells may be considered large enough to fill. Isolated empty cells 46 or even small groupings of empty cells, such as pairs or strings in single rows are columns will not be considered sufficiently large that dummy structures are placed in the area and therefore they will not be considered for inclusion in the calculations which are performed as explained herein and with respect to FIGS. 6-9.

Once the grid pattern is determined and a shape for the dummy structures has been selected a mask is designed to apply to the actual die for forming the structural features, interconnects, and dummy structures in the single layer. This method is generally performed at the design rule check stage prior to entering production. At the design rule check stage, a mask has been fully defined for the useful structures of each metal level and each poly level for the circuits to be formed therein.

This mask is then modified to add the dummy structures as explained herein. Each mask will have a different set of structural features, interconnect patterns, and dummy structure patterns. The final product, i.e., the die that is packaged and sold could have a different dummy structure pattern at each metal or poly level. In addition, the die could have different dummy structures at each metal or poly level because each unfilled space will be a different size at the different levels.

Forming dummy structures in accordance with the golden ratio as described herein results in significant reductions in erosion and dishing during CMP. The improvements do not depend on the level of the die or on the pressure applied during the CMP.

Figure 10:
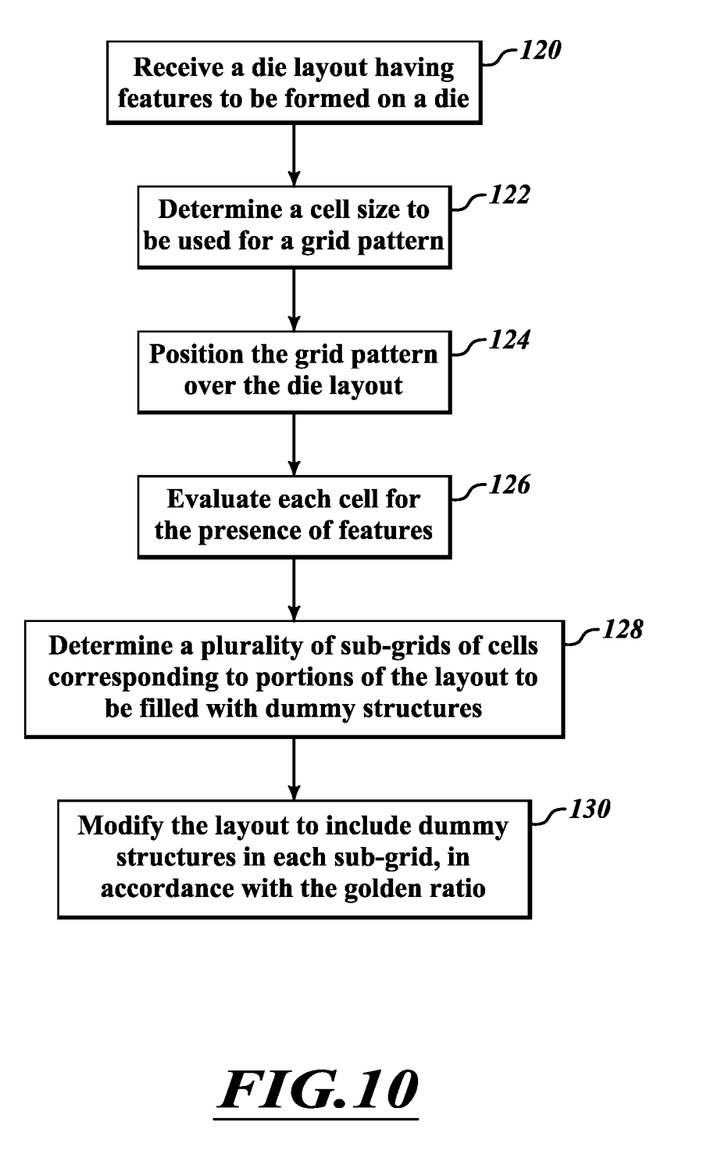
FIGS. 10 and 11 are flow charts of a method of forming dummy structures in accordance with an embodiment of the present disclosure.

FIG. 19 is a flowchart illustrating a method of determining where dummy structures are needed on a level of a die. A software tool may be used to execute this method. In step 120, a die layout is received having a plurality of features to be formed on the die. The features may be metal interconnects, such as metal 2. In step 122, a cell size of a grid pattern is determined. The cell size depends on the minimum and maximum size of the features on the die. The minimum and maximum size will be described in more detail below with respect to FIG. 11.

In step 124, the grid pattern is positioned over the die layout. In step 126, each cell of the grid pattern is evaluated for the presence of features. Each cell may be scanned or otherwise evaluated to determine if any portion of any feature is within the cell. If any portion of any feature is within the cell, then that cell is considered filled. If the cell does not include any features, then the cell is considered unfilled and will be considered in the evaluation of where dummy structures will be formed.

In step 128, a plurality of sub-grids of cells corresponding to portion of the die layout to be filled with dummy structures is determined. The sub-grids are groups of unfilled cells that are large enough to warrant filling them with dummy structures. In step 130, the layout is modified to include dummy structures in each sub-grid in accordance with the golden ratio. The layout will have both the features and the dummy structures and is used to form a mask that level of the die during manufacturing.

Figure 11:
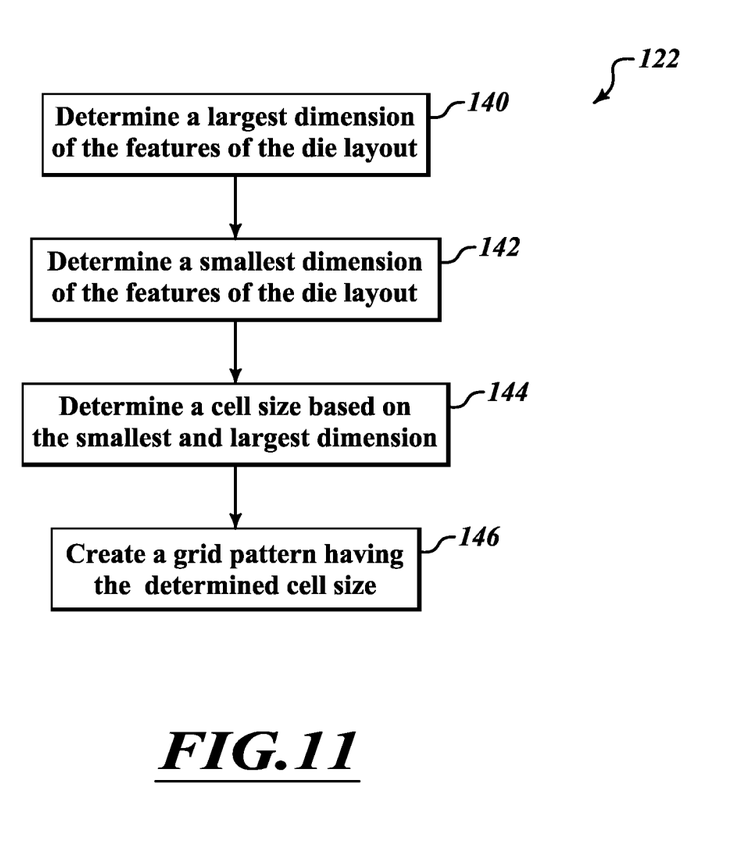

FIG. 11 is a flow chart of step 122 of FIG. 10. In particular, FIG. 11 illustrates one example of how the cell size of the grid pattern can be determined. In step 140, a largest dimension of the features on the die layout is determined. In step 142, a smallest dimension of the features on the die layout is determined. In step 144, a cell size is determined based on the smallest and largest dimensions. For example, the first equation (1) and the second equation (2) described above, may be used to determine the cell size. In step 146, a grid pattern is created having the determined cell size.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor die, comprising:
   a substrate;
   circuit components formed on the substrate;
   a first level formed above the substrate, the first level having a plurality of regions:
      a first region including first metal interconnect structures coupled to the circuit components, the first metal interconnect structures separated from each other by a first dielectric material; and
      a second region adjacent to the first region, the second region including a plurality of rectangular dummy structures formed in the first dielectric material, each dummy structure having a first dimension (a) and a second dimension (b), a ratio of the first dimension to the second dimension being equal to the golden ratio where:

$$\frac{a+b}{a} = \frac{a}{b}.$$

2. The die of claim 1 wherein each dummy structure is formed in a cell, each cell having a third dimension and a fourth dimension, a ratio of the third dimension to the fourth dimension being equal to the golden ratio, the third dimension being greater than the first dimension and the fourth dimension being greater than the second dimension.

3. The die of claim 1 wherein the first region has a first area and the second region has a second area different from the first area.

4. The die of claim 1 further comprising a second level above the first level, the second level including a plurality of regions:
   a first region including second metal interconnect structures coupled to the first interconnect structures, the second metal interconnect structures being separated from each other by a second dielectric material;
   a second region adjacent to the first region, the second region including a plurality of rectangular dummy structures formed in the second dielectric material, each dummy structure having a first dimension and a second dimension, a ratio of the first dimension to the second dimension being equal to the golden ratio.

5. The die of claim 4 wherein the dummy structures from the first level and the dummy structures from the second level are conductive.

6. A die, comprising:
   a substrate;
   a first level above the substrate, the first level including:
      a first logic area, the first logic area having a plurality of first metal interconnect structures spaced from each other by a first dielectric material;
      a first dummy area formed adjacent to the first logic area, the first dummy area including a plurality of conductive dummy structures spaced from each other by the first dielectric material, the dummy structures being approximately 62% of the first dummy area and the first dielectric material being approximately 38% of the first dummy area.

7. The die of claim 6 wherein the each dummy structure is rectangular with a first dimension (a) and a second dimension (b), a ratio of the first dimension to the second dimension being equal to the golden ratio where:

$$\frac{a+b}{a} = \frac{a}{b}.$$

8. The die of claim 6 further comprising a second level above the first level, the second level including:
   a second logic area, the second logic area having a plurality of second metal interconnect structures spaced from each other by a second dielectric material, ones of the second interconnect structures being electrically coupled to ones of the first interconnect structures;
   a second dummy area formed adjacent to the second logic area, the second dummy area including a plurality of dummy structures spaced apart from each other by the second dielectric material, the second dummy structures being approximately 62% of the second dummy area and the second dielectric material being approximately 38% of the first dummy area.

9. The die of claim 6 wherein the first dummy area is divided into a grid pattern having grid elements, the first dummy structures being in 62% of the grid elements and the first dielectric being in 38% of the grid elements.

10. The die of claim 6 wherein the first level is metal one.

11. The die of claim 6 wherein the first level is metal three.

12. The die of claim 8 wherein the first level is metal one and the second level is metal 2.

13. A device, comprising:
   a substrate;
   a level above the substrate, the level including:
      a logic area, the logic area having a plurality of metal interconnect structures spaced from each other by a dielectric material;
      a dummy area formed adjacent to the logic area, the dummy area including a plurality of conductive dummy structures spaced from each other by the dielectric material, the dummy structures being formed in 61% to 64% of the dummy area and the dielectric material being formed in 36% to 39% of the dummy area.

14. The device of claim 13 wherein the level is metal one.

15. The device of claim 13 wherein the level is metal three.

* * * * *